United States Patent [19]

Carter et al.

[11] 4,028,632
[45] June 7, 1977

[54] POWER DIVIDING AND COMBINING TECHNIQUES FOR MICROWAVE AMPLIFIERS

[75] Inventors: John L. Carter, Ocean; Joseph McGowan, Spring Lake Heights, both of N.J.

[73] Assignee: The United States of America as represented by the Secretary of the Army, Washington, D.C.

[22] Filed: Sept. 17, 1975

[21] Appl. No.: 614,711

Related U.S. Application Data

[62] Division of Ser. No. 522,177, Nov. 8, 1974, Pat. No. 3,928,806.

[52] U.S. Cl. .............................. 330/53; 330/124 R; 333/1.1; 333/24.1; 333/24.2
[51] Int. Cl.² ..................... H03F 3/60; H01P 1/36
[58] Field of Search ............. 330/53, 124 R, 124 D; 333/1.1, 6, 10, 24.1, 282

[56] References Cited

UNITED STATES PATENTS

| | | | |
|---|---|---|---|
| 3,444,475 | 5/1969 | Seidel | 333/10 X |
| 3,495,263 | 2/1970 | Amitay et al. | 333/10 X |
| 3,544,999 | 12/1970 | Michelson | 333/10 X |
| 3,865,990 | 2/1975 | Kuenemund | 333/6 X |
| 3,919,660 | 11/1975 | Beurrier | 330/53 |

Primary Examiner—Rudolph V. Rolinec
Assistant Examiner—Lawrence J. Dahl
Attorney, Agent, or Firm—Nathan Edelberg; Daniel D. Sharp; Sheldon Kanars

[57] ABSTRACT

A novel microwave power divider is disclosed that is a combination of an N-port junction circulator and a novel isolator-mismatch device for each circulator port other than one input port and divides microwave signal power incident to the input port into any desired ratio among the output ports and isolates all the ports from microwave power reflected back toward the divider after being propagated through the divider and thus prevents interaction among line devices, e.g. amplifier units, that are fed by the output ports. Also a novel microwave power combiner is disclosed that is a combination of an N-port junction circulator and a novel isolator-reflector device for each port other than one output port to combine at the one output port identical microwave signals or microwave signals that differ in frequency or phase incident to the isolator-reflector devices. The microwave power combiner, like the microwave power divider, provides isolation among the signal transmission lines. Also a novel solid-state microwave power amplifier is disclosed that includes the novel power divider, a solid-state power amplifier unit for each power fraction from the outputs of the divider and the novel power combiner for the amplified outputs of the power divider.

3 Claims, 8 Drawing Figures

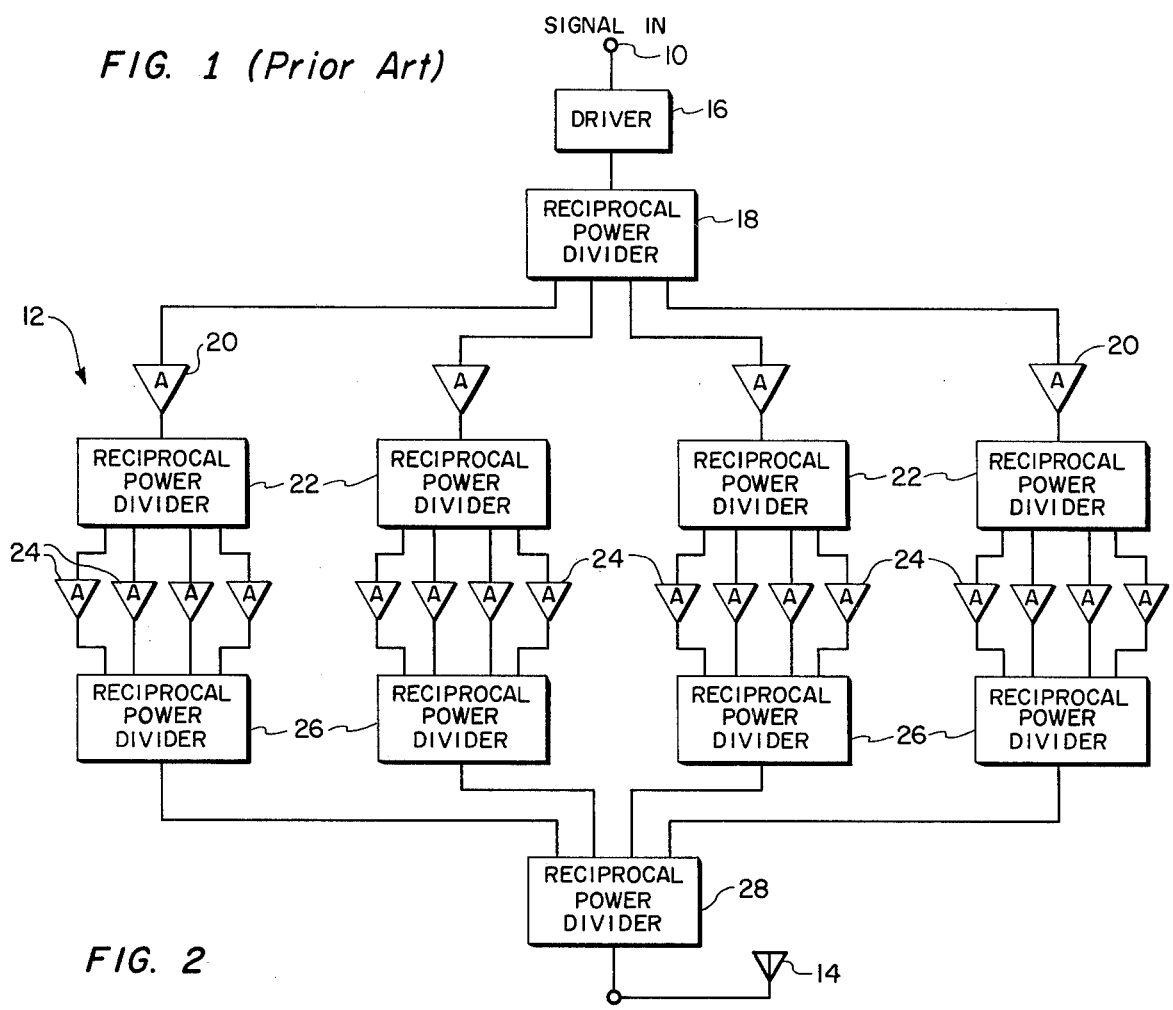
FIG. 1 (Prior Art)
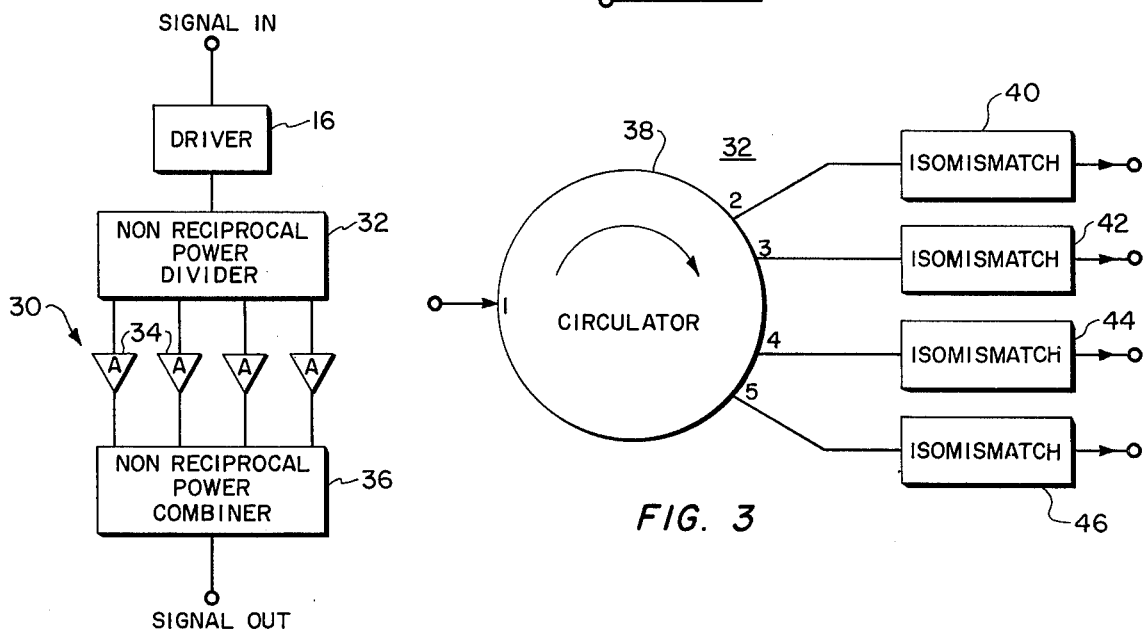
FIG. 2
FIG. 3

POWER DIVIDING AND COMBINING TECHNIQUES FOR MICROWAVE AMPLIFIERS

This is a division, of application Ser. No. 522,177, filed Nov. 8, 1974, now U.S. Pat. No. 3,928,806.

BACKGROUND OF THE INVENTION

Solid-state microwave power amplifier units have power capacity too low for the output requirements of radar and communication systems. For example, a transistor amplifier can provide 10db to 15db power gain with a power output level on the order of 10 watts. For microwave applications that have power output requirements far in excess of 10 watts, a solid-state power amplifier unit cannot be used to provide that output level. A power amplifier embodying a corporate feed technique has been used for this purpose. Signal power to be amplified, but which is at too high a power level for a single solid-state amplifier unit is processed through a microwave reciprocal power divider which divides microwave signal power into several power fractions, each of which is low enough for a solid-state power amplifier unit. If the gain is sufficient to satisfy output requirements, the amplified signal power fractions are processed through another reciprocal power divider, operating as a power combiner and the combined microwave signal power is delivered to the load. If the gain is not sufficient, an additional stage or stages of dividers for the output power of each solid-state amplifier unit further subdivides the several amplified signal powers and a solid-state amplifier unit is provided for each further subdivided signal power fraction delivered by the dividers. Then, when the total power is sufficient one or more additional stages of power dividers connected inversely as power combiners concentrate the power subdivisions into one single output. The microwave reciprocal power dividers are available commercially and are marketed according to power division factor, power capacity, and frequency band. However, a major disadvantage of the prior art corporate feed arrangement is interaction between amplifier units or other line devices in different transmission lines due to signal power reflections through the reciprocal power dividers. Also the combining properties of the corporate feed arrangement requires close control of frequency and phase of the individual signals to be combined since it cannot combine satisfactorily signals of random frequency and phase relationships. In particular, the conventional power combiner cannot be used to combine signals of different frequencies to feed a single antenna without excessive loss, i.e. loss exceeding 6db.

SUMMARY OF THE INVENTION

The disadvantages of the prior art amplifier arrangements are overcome by the use of a nonreciprocal power divider and a nonreciprocal power combiner. Each of the nonreciprocal divider and nonreciprocal combiner includes an N-port circulator. A discussion on N-port circulators is in IRE Transactions on Microwave Theory and Techniques, Volume MTT-10, Number 6, November 1962, Page 551 and is entitled Synthesis of N-Port Circulator, by D. L. Humphries and J. P. Davis. In the divider, each port of the circulator other than one input port is coupled to an isolator-mismatch device that is a two-port device and that transmits power in one direction only, outward from the circulator. No reflected power is returned through any isolator-mismatch device to the N-port circulator. Any reflected power incident to an isolator-mismatch device in the reverse direction is absorbed in the isolator-mismatch device. The mismatch factor for the several isolator-mismatch devices coupled to the output ports of one circulator differ and may be selected so that there are either equal or unequal subdivisions of the power input to the circulator emitted from its output ports. The isolator-mismatch device coupled to the last output port transmits all of the power output from that port. If the second from last isolator-mismatch device transmits one-half the incident power from its circulator port and reflects one-half the incident power back to its circulator port and the reflected one-half continues on the last port, the power outputs through the last two isolator-mismatch devices are equal. Similarly, if the third from last isolator-mismatch device transmits one-third of the power incident from its circulator port and reflects two-thirds back to its circulator port and the reflected two-thirds continues on to the next to last port where halving occurs as described above and one-third exits through the next to last port and one-third exits through the last port as described above, the three outputs are equal. If there are more than three output ports and if the mixmatch ratio for the isolator-mismatch device for those ports is such that the fraction of power transmitted is equal to the reciprocal of the numerical position of the output port as counted backward, all the outputs are equal. Any subdivision ratio can be obtained. The circulator of the power combiner is operated with one of its ports as an output port and with all its other ports as input ports. An isolator-reflector device which is a two-port device is provided for each circulator input port. Each isolator-reflector device transmits power in one direction only, into the circulator. Any power incident from the circulator port is reflected back to the circulator port. Therefore, signal powers incident to all the input ports are combined and exit the circulator at its output port only. Solid-state power amplifier units between the power divider and power combiner serve the same function as in the prior art corporate feed arrangement. The power divider and power combiner have utility apart from their combination in a power amplifier. The operation of the power divider and of the power combiner is not affected by the frequencies or relative phases of the individual signals. Only the propagating direction of signal energy relative to the divider or combiner determines the action of the divider or combiner on that signal energy.

DESCRIPTION OF THE FIGURES

FIG. 1 is a block diagram of a prior art corporate feed type of solid-state power amplifier arrangement;

FIG. 2 is a block diagram of a preferred embodiment of a microwave power amplifier according to this invention;

FIG. 3 is a block diagram of a nonreciprocal power divider according to this invention;

DESCRIPTION OF A PREFERRED EMBODIMENT

Figure 4:
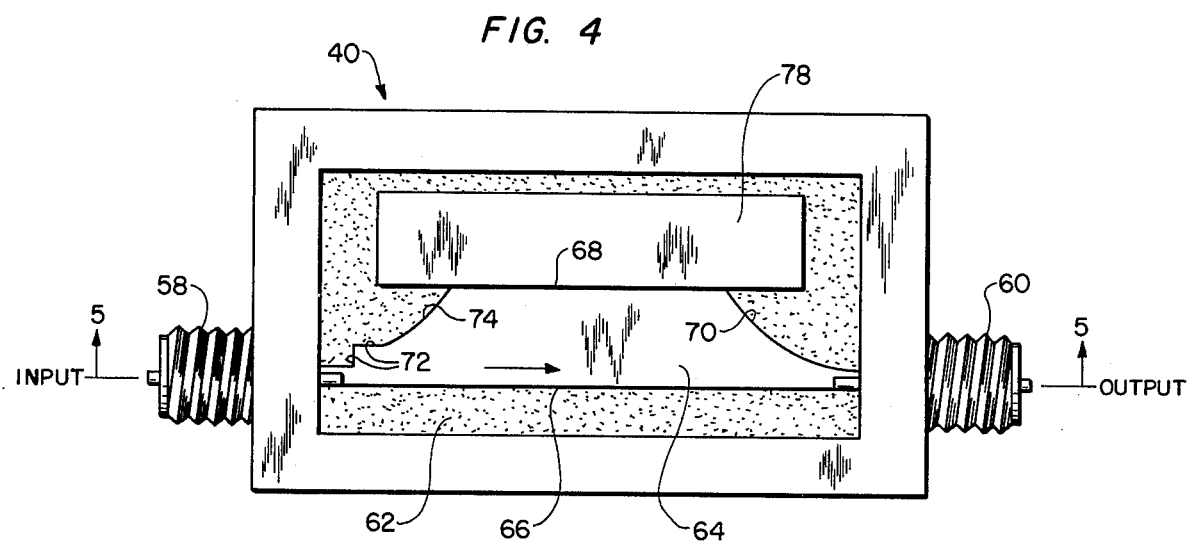
FIG. 4 is a top plan view of an isolator-mismatch device according to this invention for the nonreciprocal power divider shown in FIG. 3.

A corporate feed power amplifier arrangement in the prior art is shown in FIG. 1. A microwave signal coupled to the input terminal 10 of a power amplifier 12 is radiated by an antenna 14 at a power level much higher than the power capacity of a solid-state amplifier unit, viz. a transistor amplifier, with a power gain of only 10–15db and an output power level of about 10 watts. The signal power level is raised initially in a driver 16. A microwave reciprocal power divider 18 coupled to the output of the driver subdivides the signal power from the driver 16 into approximately equal fractions, the subdivision factor depends on the prior art divider selected. In the drawing, the divider 18 has four outputs each of which delivers one-fourth the signal power from the driver. A solid-state amplifier unit 20 is coupled to each output of the reciprocal power divider 18. If the total signal power from the four amplifier units 20 is not adequate to meet the system requirements for output signal power to be radiated by the antenna, another stage of reciprocal power dividers 22 and another stage of solid-state amplifier units 24 are included in power amplifier 12. The power amplifier 12 is designed such that total signal power from the last stage of solid-state amplifier units is sufficient for system requirements. Two stages of reciprocal power dividers 26, 28 are inversely connected as power combiners to deliver the total power output of amplifier units 24 to antenna 14. All of the power dividers and power combiners are marketed commercially, and if selected to have the power capacity of power combiner 28, they may be identical. The major disadvantages of this power amplifier circuit is the interaction between individual amplifiers due to reflected signals coupling through the reciprocal power dividers and the required close control of frequency and relative phase of the individual signals.

A power amplifier 30 according to this invention that is shown in FIG. 2 overcomes the disadvantages of the prior art by the use of a nonreciprocal power divider 32 instead of a reciprocal power divider 18 as in FIG. 1 for subdividing the output signal power of driver 16 into equal or unequal fractions. Solid-state amplifier units 34 are coupled to the outputs of the power divider 32 as in FIG. 1 and their amplified outputs are combined by a nonreciprocal power combiner 36 instead of a reciprocal power combiner 28 as shown in FIG. 1. To increase the gain of power amplifier 30, additional stages of power dividers, solid-state amplifier units, and power combiners are included as in FIG. 1.

A nonreciprocal power divider 32 according to this invention, shown in FIG. 3, includes an N-port circulator 38. In the drawing, the circulator has five ports but this is not intended as a limitation. Isolator-mismatch units 40, 42, 44, 46 are coupled to the four circulator ports other than the first or input port. Each isolator-mismatch unit, hereinafter termed isomismatch, is a two-port stripline device which reflects a predetermined fraction of signal power incident from the respective circulator port and transmits the remaining fraction and also absorbs any signal power incident from the opposite direction, thus preventing any signal power reflection back through the isomismatch to the circulator port. Since the isomismatches absorb all power reflected from the amplifiers, reflections from the amplifiers are isolated from the input port. Therefore, the nonreciprocal divider 32 that includes circulator 38 and isomismatches 40, 42, 44, 46 subdivides incident power into predetermined fractional parts that are equal or unequal. The isomismatch 46 coupled to the last output port is made to transmit all of the power incident from the last circulator output port. For the fourth port to transmit the same amount of signal power as the last output port, the isomismatch 14 is made to transmit one-half the incident signal power from the fourth port and to reflect back to the circulator the other one-half of the incident power which then propagates through the last port. Similarly, the isomismatch 42 transmits one-third and reflects back to the circulator two-thirds of the power incident from the third port and the isomismatch 40 transmits one-fourth and reflects back to the circulator three-fourths of the power incident from the second port, for subdivision of the input power into four equal parts.

Figure 5:
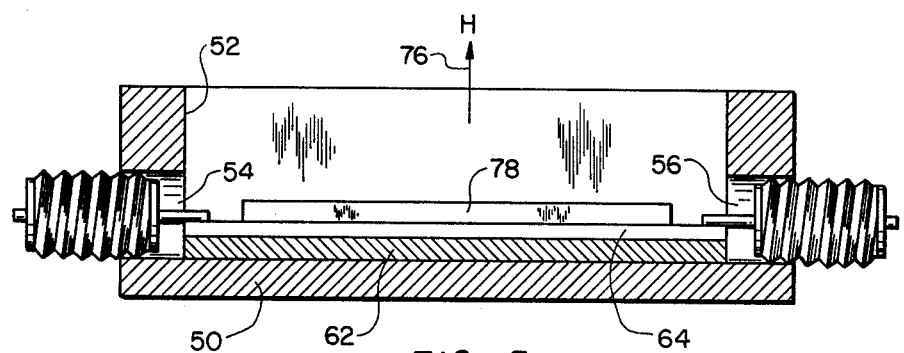
FIG. 5 is a cross section taken on line 5—5 of FIG. 4.

A representative isomismatch 40 for the nonreciprocal power divider shown in FIG. 3 is illustrated in FIGS. 4 and 5. Isomismatch 40 includes a rectangular metal plate 50 for defining a ground plane and has a recess 52. The ends of the perimeter around the recess have opposed perforations 54, 56 for seating input and output transmission line connectors 58, 60. A ferrite sheet 62 covers the bottom of the recess in plate 50. A metal conductor strip 64 overlays part of the area of the ferrite and extends longitudinally end-to-end of the ferrite with one edge 66 rectilinear and in line with and conductively joined to the center conductors of the connectors 58 and 60. The metal conductor strip has a parallel edge 68. The impedance of the conductor strip is inversely proportional to its width. At its output end the conductor strip 64 has an exponential taper 70 for impedance matching. At its input end the conductor strip has a step 72 to reflect a predetermined fraction of the incident microwave power; the step 72 is followed by an exponential taper 74 to the edge 68 to an impedance on the order of one ohm. Assuming that the input line impedance is 50 ohms, Table I provides basic design information for selected percentages of reflected signal power.

TABLE 1

| r² | r | Z/Z₀ | Z |
|---|---|---|---|
| .75 | .86 | .075 | 3.76 |
| .66 | .81 | .1029 | 5.25 |
| .50 | .707 | .1716 | 8.58 | where:
r² = percentage of incident power reflected
r = reflection coefficient
Z₀ = input transmission line impedance (50 ohms)
Z = impedance of the step 72

$$\frac{1-r}{1+r} = Z/Z_o = VSWR$$

The percentage of incident power transmitted is equal to 1-r². A d-c magnetic field H is directed through the plate 40 normal to the ferrite 62 and the conductor sheet 68 and is either in the direction indicated by the arrow 76 or in the reverse direction. A wide strip on a ferrite substrate has the property that all power propagating in one direction is concentrated on one side of the strip while power propagating in the other direction is concentrated on the other side of the strip. Therefore, a strip of Mylar coated with a resistance film is placed alongside and in contact with the edge 68 of the conductor sheet 64. The magnetic biasing field is adjusted for low attenuation to power from the input port while power incident at the output port is absorbed by the resistance film coating on the Mylar strip. Therefore the power divider shown in FIG. 3 consisting of a circulator and isomismatch is nonreciprocal.

Figure 6:
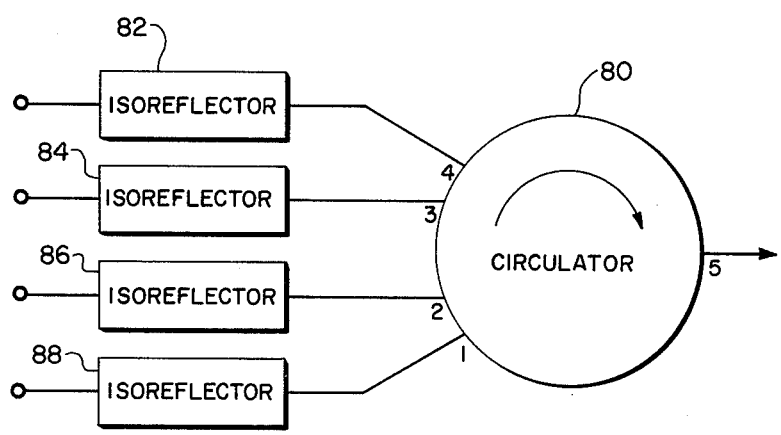
FIG. 6 is a block diagram of a nonreciprocal power combiner according to this invention.
Figure 7:
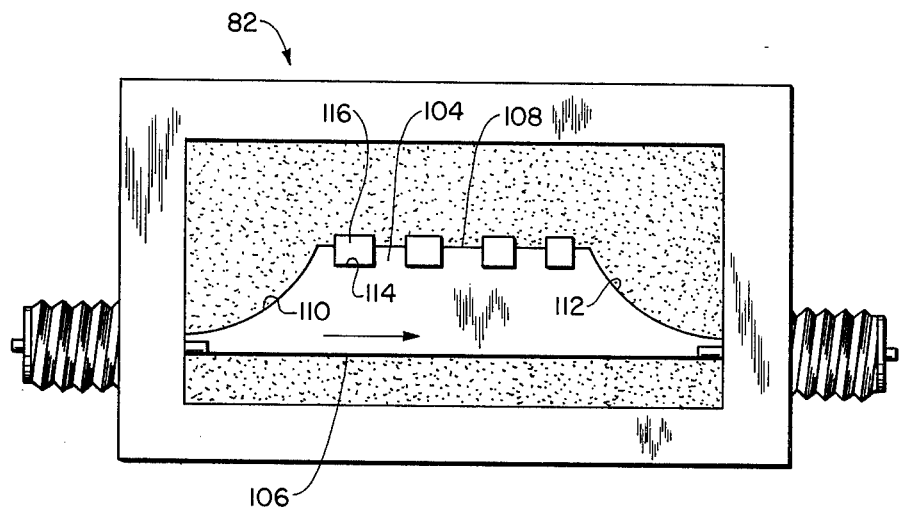
FIG. 7 is a top plan view of an isolator-reflector device according to this invention for the nonreciprocal power combiner shown in FIG. 6.
Figure 8:
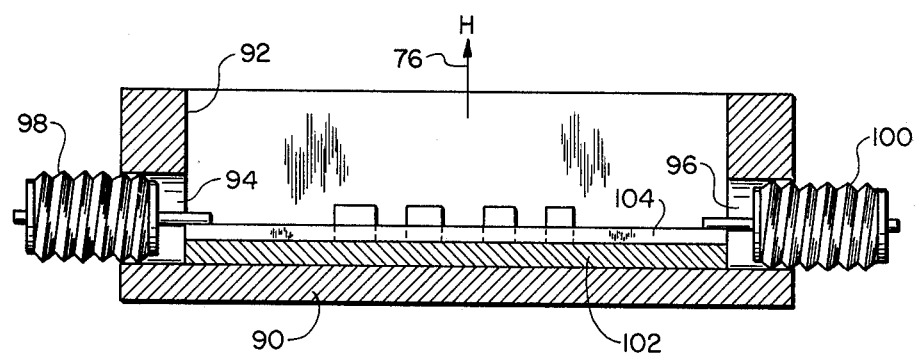
FIG. 8 is a cross section taken on line 8—8 of FIG. 7.

A nonreciprocal power combiner according to this invention shown in FIG. 6 includes an N-port function circulator 80 having the same number of ports as circulator 38 in FIG. 3. Only the last port is used as an output port; all of the other ports are input ports. Isolator-reflector units 82, 84, 86, 88 hereinafter termed isoreflectors are coupled to the four input ports of the circulator. Each isoreflector is a two-port stripline device that transmits all the microwave power incident to the isoreflector at its input port and reflects all the microwave power incident to the isoreflector at its output port. Therefore, all the microwave signal power incident to the isoreflectors are delivered at the circulator output port. The utility of the power combiner is not limited to combining identical signals; it can couple several signals differing in phase or several distinct signals of different frequencies to a single antenna or other load. An isoreflector 82 similar to the isomismatch in FIGS. 4 and 5 is shown in FIGS. 7 and 8. It includes a rectangular metal plate 90 for defining a ground plane and having a recess 92 and opposed perforations 94, 96 in the ends of the perimeter surrounding the recess for seating input and output transmission line connectors 98, 100. A ferrite sheet 102 covers the bottom of the recess in plate 90. A metal conductor strip 104 overlays part of the area of the ferrite and extends longitudinally end-to-end of the ferrite with one edge 106 rectilinear and in line with and conductively joined to the center conductors of the connectors 98 and 100. The metal conductor strip has a parallel edge 108. However, in the isoreflector the conductor strip 104 has exponential tapers 110, 112 at both ends between the parallel edges 106, 108 to match the impedance of the conductor strip to the input and output transmission line impedances. Also, the edge 108 of the conductor strip is formed with several notches 114 in which are nested dielectric resonators 116. Preferably, the resonators are fabricated from a dielectric material with a dielectric constant greater than 50 and a loss factor less than 0.0001. Examples of suitable materials are rutile and magnesium titanate. The resonators dimensions are selected for resonances over a selected frequency range. The several resonators with spaced resonant frequencies provide a wide bandwidth. Band stop response is obtained by choice of spacing and resonant frequencies of the resonators. A d-c magnetic field H is directed normal to the isoreflector in the direction indicated by the arrow or in the opposite direction. The isoreflector can provide rejection of at least 40db over a frequency range at least 2–4 GHz. The magnetic field is adjusted so that power at the input port propagates on the conductor strip 104 to the output port concentrated on the side away from the dielectric resonators so as not to couple to the resonators. Power incident at the output port propagates on the conductor strip and is concentrated on the side coupled to the resonators which operates to reflect any power incident to the isoreflector at its output port in the frequency range covered by the resonators.

In the power combiner shown in FIG. 6, power incident at the input of isoreflector 88 is propagated to port 1 of the circulator, then through the port 2 to isoreflector 84 where it is reflected by isoreflector 86 back to port 2. The power incident at the input isoreflector 86 combines with the power from port 1 and is propagated through port 3 where it is reflected by isoreflector 84 back to port 3 and combines with power incident to the input port of isoreflector 84. The circulating signal powers combine in this manner with power incident to the port 82 and all the power is propagated to the fifth or output port and exits that port.

The operation of the power combiner and of the power divider respectively do not require that signals be in phase nor that the signals be of the same frequency. Only the propagating directions of the signals relative to the isomismatch or the isoreflector is significant. Therefore, signals of random phases or frequencies can be combined or divided and several signals of random frequencies or phases can be combined to feed a single antenna.

What is claimed is:

1. A power amplifier comprising:
   nonreciprocal means for subdividing the power of an input microwave signal into N fractions and for isolating the N fractions from one another,
   N substantially identical solid-state power amplifier units for amplifying the N fractions respectively, and
   nonreciprocal means for combining the amplified fractions and emitting them as a single output,
   said nonreciprocal combining means including a circulator having a plurality of input ports and one output port and a plurality of isoreflectors each having an input port and an output port,
   each of said isoreflectors output ports being connected to corresponding ones of said circulator input ports,
   each isoreflector being operable to transmit power received from the corresponding power amplifier unit and incident at the isoreflector input port and operable to reflect all power incident at said isoreflector output port,
   said output port of the circulator providing the aforesaid single output.

2. A power amplifier according to claim 1 wherein said nonreciprocal power subdividing means includes
   an N-port circulator including one input port and N-1 output ports
   a two-port isomismatch having an input port coupled to each of the N-1 circulator output ports respectively and an output port coupled to a corresponding one of said amplifier units,
   each isomismatch absorbing all signal power input to its output port,
   the isomismatch device coupled to the Nth circulator output port transmitting all of the incident microwave signal power from the Nth circulator port, and
   each of the isomismatches coupled to the other circulator output ports transmitting a predetermined fraction of the microwave signal power incident from the respective circulator port and reflecting the remainder back toward the respective circulator port, to divide the microwave signal power incident to the circulator input port into predetermined fractions that sum to substantially the signal power input to the circulator.

3. A power amplifier comprising:

nonreciprocal means for subdividing the power of an input microwave signal into N fractions and for isolating the N fractions from one another, N substantially identical solid-state power amplifier units for amplifying the N fractions respectively, nonreciprocal means for combining the amplified fractions and emitting them as a single output, said nonreciprocal power subdividing means including an N-port circulator including one input port and N-1 output ports, a two-port isomismatch having an input port coupled to each of the N-1 circulator output ports respectively and an output port coupled to a corresponding one of said amplifier units, each isomismatch absorbing all signal power input to its output port, the isomismatch device coupled to the Nth circulator output port transmitting all of the incident microwave signal power from the Nth circulator port, and each of the isomismatches coupled to the other circulator output ports transmitting a predetermined fraction of the microwave signal power incident from the respective circulator port and reflecting the remainder back toward the respective circulator port, to divide the microwave signal power incident to the circulator input port into predetermined fractions that sum to substantially the signal power input to the circulator.

* * * * *